(12) United States Patent
Hiyama

(10) Patent No.: US 8,421,163 B2
(45) Date of Patent: Apr. 16, 2013

(54) POWER MODULE

(75) Inventor: Kazuaki Hiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 48 days.

(21) Appl. No.: 13/097,389

(22) Filed: Apr. 29, 2011

(65) Prior Publication Data

US 2012/0032725 A1    Feb. 9, 2012

(30) Foreign Application Priority Data

Aug. 4, 2010    (JP) .................................. 2010-175372

(51) Int. Cl.
*H01L 27/088*    (2006.01)
(52) U.S. Cl.
USPC ............ 257/394; 257/392; 257/393; 257/690; 257/691; 438/217; 438/276; 438/289; 438/291
(58) Field of Classification Search .................. 257/392, 257/393, 394, 690, 691; 438/217, 276, 289, 438/291
See application file for complete search history.

(56) References Cited

U.S. PATENT DOCUMENTS 6,351,399 B2 * 2/2002 Takanashi et al. ......... 363/56.05
7,777,433 B2 * 8/2010 Yamaguchi et al. .......... 318/139

FOREIGN PATENT DOCUMENTS

| JP | 4-199567 | 7/1992 |
|---|---|---|
| JP | 7-273276 | 10/1995 |
| JP | 8-195471 | 7/1996 |
| JP | 10-125856 | 5/1998 |
| JP | 2001-85612 | 3/2001 |
| JP | 2002-33446 | 1/2002 |
| JP | 2007-43797 | 2/2007 |

* cited by examiner

*Primary Examiner* — Thinh T Nguyen
(74) *Attorney, Agent, or Firm* — Oblon, Spivak, McClelland, Maier & Neustadt, L.L.P.

(57) ABSTRACT

A power module comprises: first and second terminals; first and second switching elements having a first electrode and a second electrode which is connected to the second terminal; first and second wirings respectively connecting the first electrodes of the first and second switching elements to the first terminal; and a third wiring directly connecting the first electrode of the first switching element to the first electrode of the second switching element, wherein parasitic inductances of the first and second wiring are different or switching characteristics of the first and second switching elements are different.

6 Claims, 11 Drawing Sheets

POWER MODULE

BACKGROUND OF THE INVENTION

1. Field of the Invention

The present invention relates to a power module comprising a plurality of switching elements connected in series, and in particular to a power module capable of reducing the radiation noise.

2. Background Art

In a power module, such as an inverter, a switching element, such as an IGBT (Insulated Gate Bipolar Transistor), a MOSFET (Metal Oxide Semiconductor Field Effect Transistor), and a diode, is mounted. The size of the switching element is increased or decreased corresponding to the required capacity. When the capacity is large, the element size is also increased. However, if the element size is extremely large, the yield is lowered, and the manufacturing becomes difficult. Therefore, there is a certain limitation in the largest element size. For this reason, if the capacity is insufficient with just one element, a plurality of elements are connected in series (for example, refer to Japanese Patent Application Laid-Open No. 08-195471).

SUMMARY OF THE INVENTION

When the parasitic inductances of a plurality of wirings each connecting a plurality of switching elements to the terminals, respectively differ, high-frequency oscillation is formed between the plurality of elements. When the difference in the performances of a plurality of elements is large, the switching performances of a plurality of elements are different. In this case also, high-frequency oscillation occurs between a plurality of elements. There is a problem wherein the radiation noise level at the oscillation frequency is elevated by the high-frequency oscillation, and various EMI (electromagnetic interference) regulations cannot be satisfied.

In view of the above-described problems, an object of the present invention is to provide a power module capable of reducing the radiation noise.

According to the present invention, a power module comprises: first and second terminals; first and second switching elements having a first electrode and a second electrode which is connected to the second terminal; first and second wirings respectively connecting the first electrodes of the first and second switching elements to the first terminal; and a third wiring directly connecting the first electrode of the first switching element to the first electrode of the second switching element, wherein parasitic inductances of the first and second wiring are different or switching characteristics of the first and second switching elements are different.

The present invention makes it possible to reduce the radiation noise.

Other and further objects, features and advantages of the invention will appear more fully from the following description.

DETAILED DESCRIPTION OF THE PREFERRED EMBODIMENTS

A power module according to the embodiments of the present invention will be described with reference to the drawings. The same components will be denoted by the same symbols, and the repeated description thereof may be omitted.

First Embodiment

Figure 1:
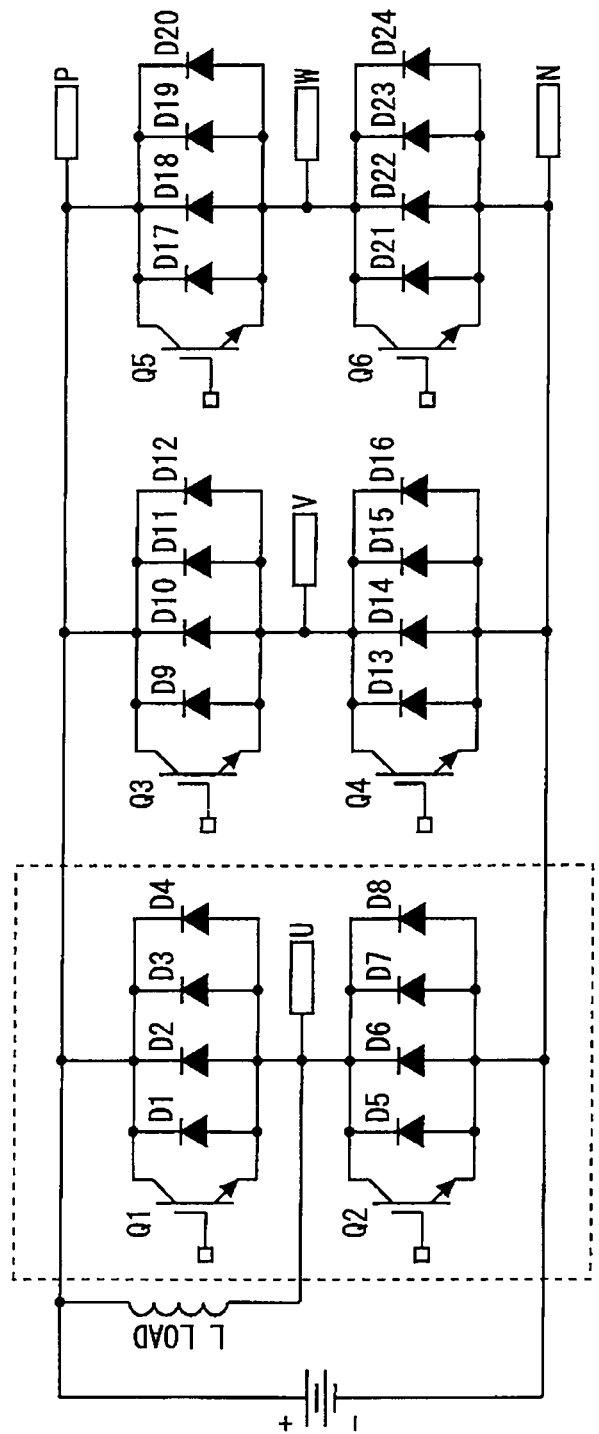
FIG. 1 is a circuit diagram showing a three-phase inverter.

FIG. 1 is a circuit diagram showing a three-phase inverter. In a U-phase arm, a transistor Q1 and diodes D1 to D4 are connected in parallel between the P-terminal and the U-terminal; and a transistor Q2 and diodes D5 to D8 are connected in parallel between the U terminal and the N-terminal. In a V-phase arm, a transistor Q3 and diodes D9 to D12 are connected in parallel between the P-terminal and the V-terminal; and a transistor Q4 and diodes D13 to D16 are connected in parallel between the V terminal and the N-terminal. In a W-phase arm, a transistor Q5 and diodes D17 to D20 are connected in parallel between the P-terminal and the W-terminal; and a transistor Q6 and diodes D21 to D24 are connected in parallel between the W terminal and the N-terminal. An inductance load (L load) is connected between the P-terminal and the U-terminal. Although the transistors Q1 to Q6 are IGBTs, these can be MOSFETs or the like.

Figure 2:
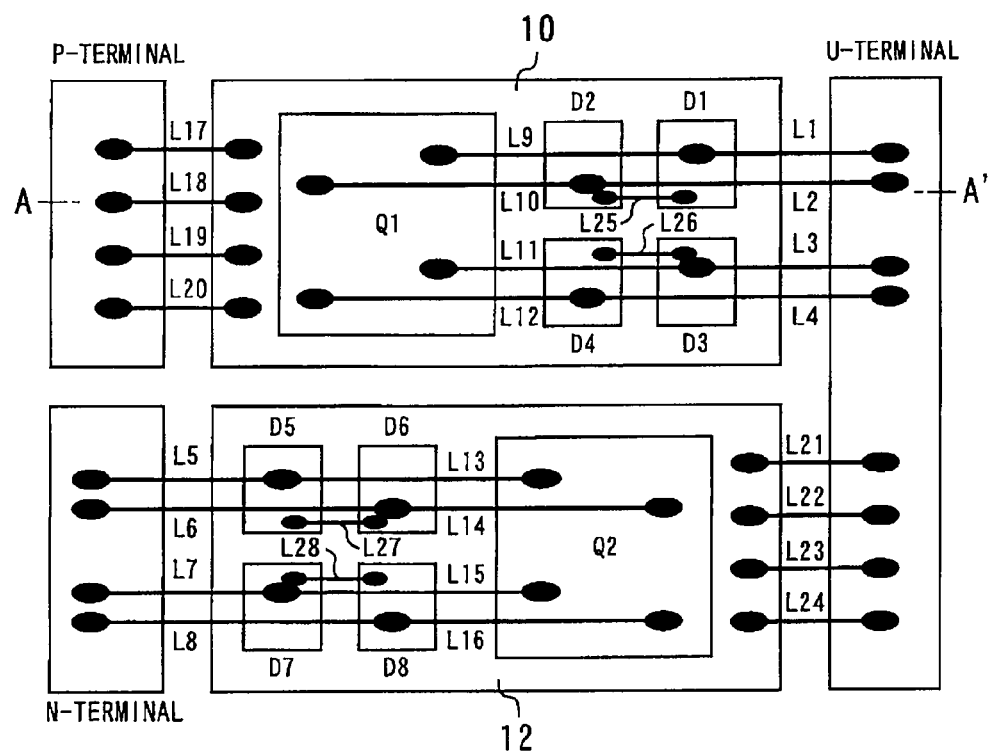
FIG. 2 is a top view showing a power module according to the first embodiment.
Figure 3:
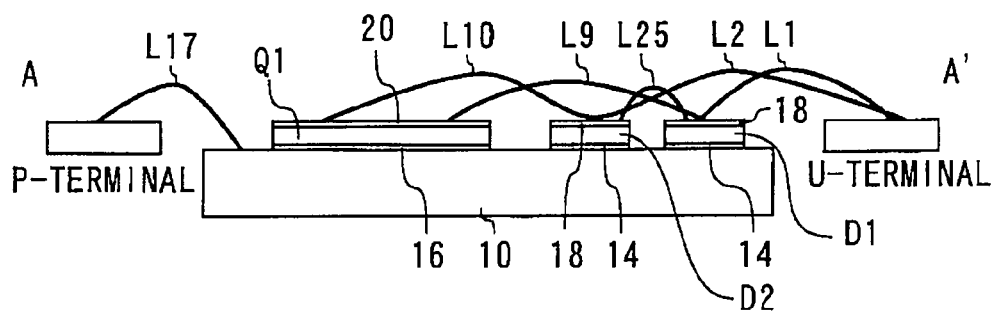
FIG. 3 is a sectional view along the line A-A' on FIG. 2.

FIG. 2 is a top view showing a power module according to the first embodiment, and FIG. 3 is a sectional view along the line A-A' on FIG. 2. The power module corresponds to the U-phase arm of the three-phase inverter shown in FIG. 1.

A conductive board 10 is formed between the P-terminal and the U-terminal; and a conductive board 12 is formed between the N-terminal and the U-terminal. A transistor Q1 and diodes D1 to D4 are mounted on the conductive board 10. A transistor Q2 and diodes D5 to D8 are mounted on the conductive board 12.

The cathode 14 of the diodes D1 to D4 and the collector electrode 16 of the transistor Q1 are connected to the conductive board 10; and the cathode 14 of the diodes D5 to D8 and the collector electrode 16 of the transistor Q2 are connected to the conductive board 12.

Al wires L1 to L4 connect the anodes 18 of the diodes D1 to D4 to the U-terminal, respectively. Al wires L5 to L8 connect the anodes 18 of the diodes D5 to D8 to the N-terminal, respectively.

Al wires L9 to L12 connect the anodes 18 of the diodes D1 to D4 to the emitter electrodes 20 of the transistor Q1, respectively. Al wires L13 to L16 connect the anodes 18 of the diodes D5 to D8 to the emitter electrodes 20 of the transistor Q2, respectively. Al wires L17 to L20 connect the conductive board 10 to the P-terminal; and Al wires L21 to L24 connect the conductive board 12 to the U-terminal. In the drawing, although each of Al wires L1 to L16 connected to the diode is shown by one line, since the current that can flow in a wire is limited, a plurality of wires are practically used corresponding to the capacity.

The diodes D1 to D4 are placed so that the size of the conductive board 10 is reduced. Therefore, the length of Al wires L1 and L3 differs from the length of Al wires L2 and L4, and the parasitic inductances of them are also different.

In the present embodiment, Al wires L25 to L28 are added to directly connect the anodes 18 of the diodes D1, D3, D5, and D7 to the anodes 18 of the diodes D2, D4, D6, and D8. Since the Al wires L25 to L28 connect between the diodes in a short distance, the parasitic inductance thereof is lower than the parasitic inductance of the Al wires L1 to L8.

Since no load current flows in Al wires L25 to L28, the use of a plurality of wires is not required. Therefore, the resistance value of the Al wires L25 to L28 is higher than the resistance value of the Al wires L1 to L8. In addition, since the frequency of high-frequency oscillation elevates, the resistance component of Al wires L25 to L28 is also elevated by the skin effect.

Figure 4:
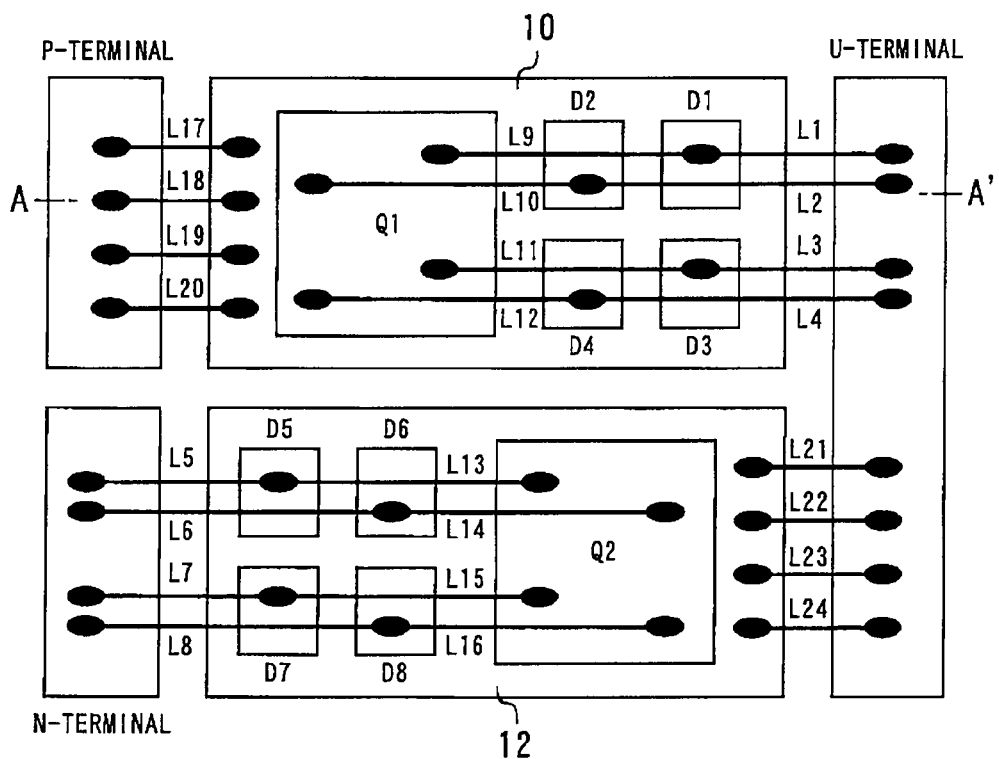
FIG. 4 is a top view showing a power module according to the first comparative example.
Figure 5:
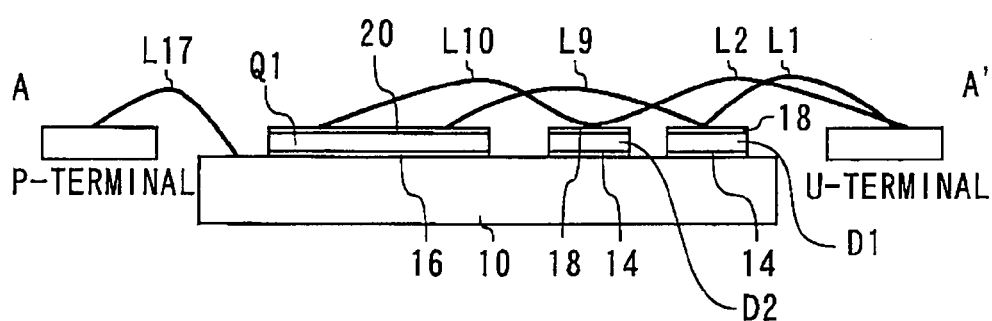
FIG. 5 is a sectional view taken along the line A-A' in FIG. 4.

Next, the effect of the first embodiment will be described in comparison with the first comparative example. FIG. 4 is a top view showing a power module according to the first comparative example. FIG. 5 is a sectional view taken along the line A-A' in FIG. 4. No Al wires L25 to L28 are present in the first comparative example.

Figure 6:
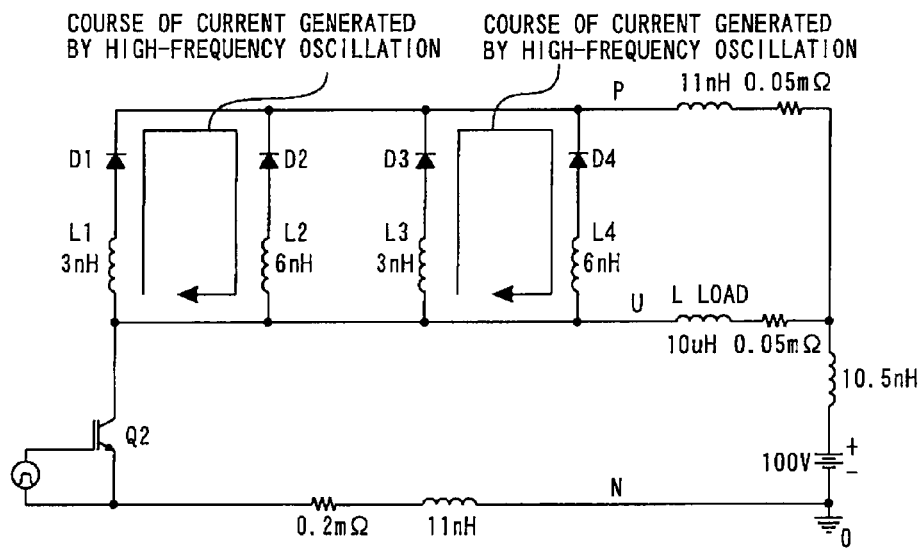
FIG. 6 is an equivalent circuit of a power module according to the first comparative example.
Figure 7:
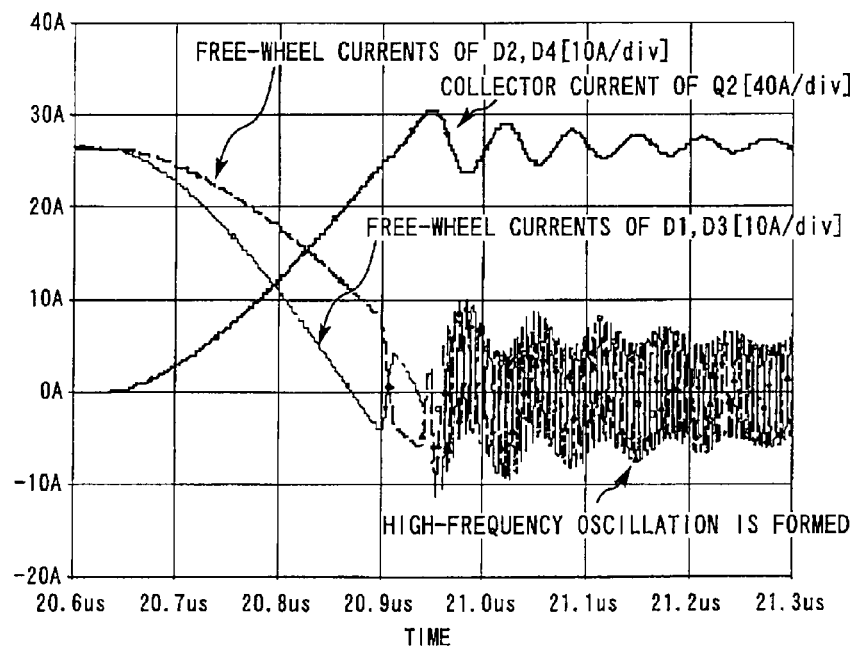
FIG. 7 is the result of simulation for the first comparative example.

FIG. 6 is an equivalent circuit of a power module according to the first comparative example; and FIG. 7 is the result of simulation for the first comparative example. The simulation was carried out at the time of turning ON of the transistor Q2 in the circuit of FIG. 6. Since the parasitic inductance of Al wires L1 and L3 is different from the parasitic inductance of Al wires L2 and L4, the trailing speeds of free-wheel currents flowing in the diodes D1 and D3, and D2 and D4 are different; and timing when the recovery current flows is also different. As a result, high-frequency oscillation occurs between diodes D1 and D4 connected in parallel, and current flows. The current cannot be observed by observing load current or the collector current of the transistor Q2. In addition, high-frequency oscillation is not attenuated in the first comparative example immediately.

Figure 8:
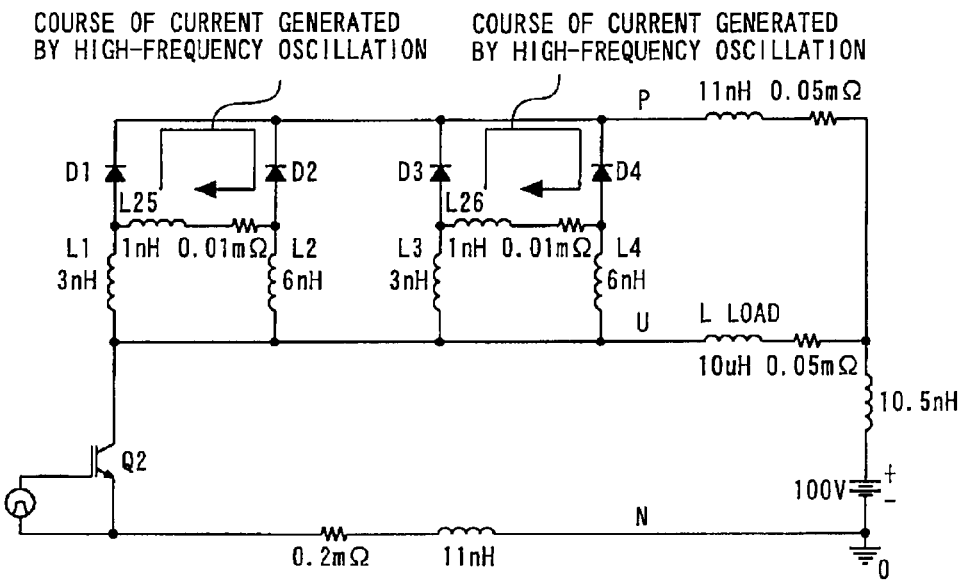
FIG. 8 is an equivalent circuit of the power module according to the first embodiment.
Figure 9:
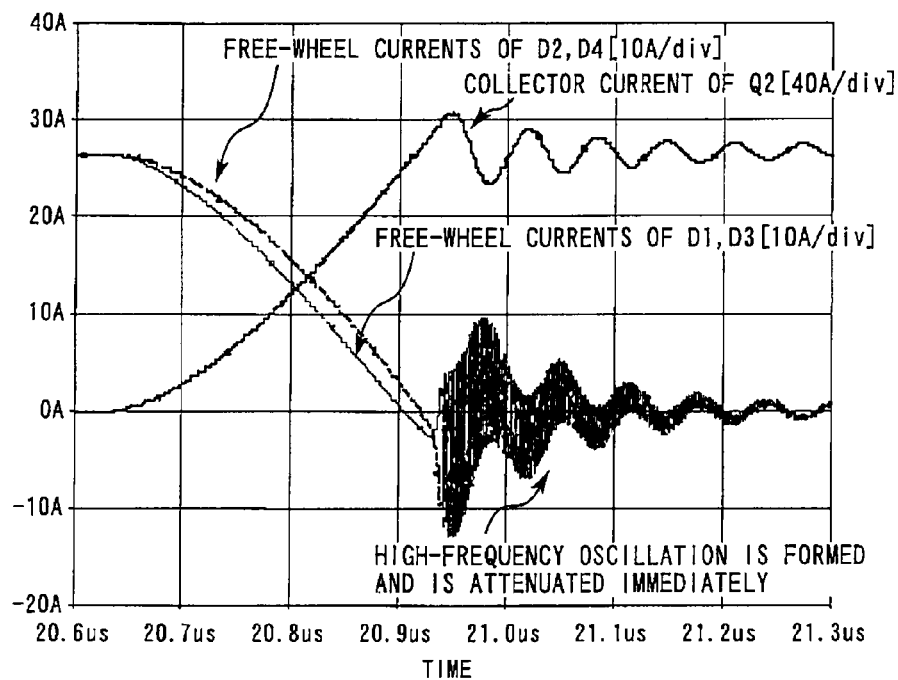
FIG. 9 is the result of simulation for the first embodiment.

FIG. 8 is an equivalent circuit of the power module according to the first embodiment; and FIG. 9 is the result of simulation for the first embodiment. The simulation was carried out at the time of turning ON of the transistor Q2 in the circuit of FIG. 8. In comparison with the first comparative example, the frequency of high-frequency oscillation is high, and the high-frequency signals are attenuated immediately.

In the first comparative example, the current generated by high-frequency oscillation flows through L1 to L4; however, in the first embodiment, the current generated by high-frequency oscillation flows through Al wires L25 and L26. Thereby, in the first embodiment, the frequency of the high-frequency oscillation is elevated. Therefore, the frequency band of the high-frequency oscillation can be transited to a band having practically no problems (out of the band regulated by various EMI standards), the radiation noise can be reduced. The resonance frequency is determined by the parasitic inductance of wiring and the inter-terminal capacity of the element.

Furthermore, since the resistance values of Al wires L25 and L26 are large, the energy of the high-frequency oscillation is inverted to a Joule heat in the Al wires L25 and L26. Therefore, since high-frequency oscillation is attenuated in a short time, the radiation noise can be reduced.

Second Embodiment

Figure 10:
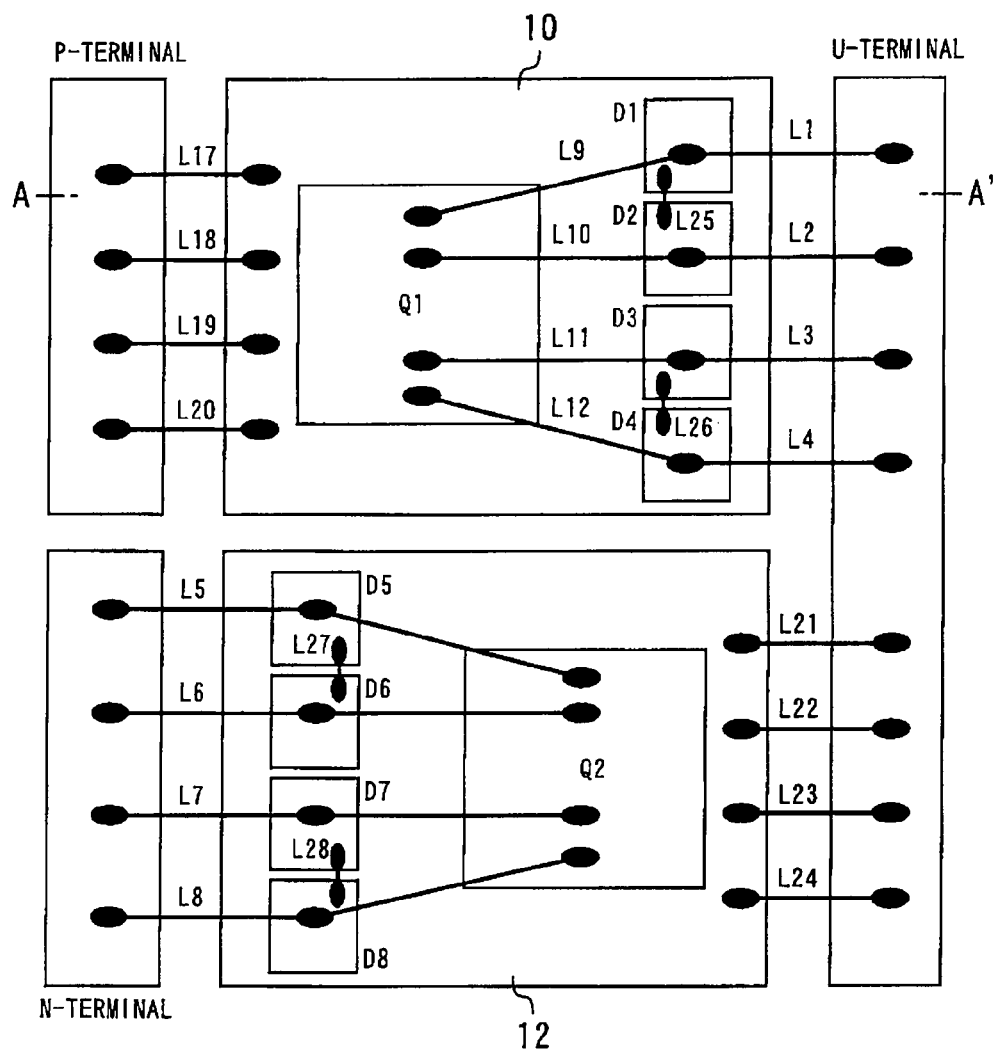
FIG. 10 is a top view showing a power module according to the second embodiment.
Figure 11:
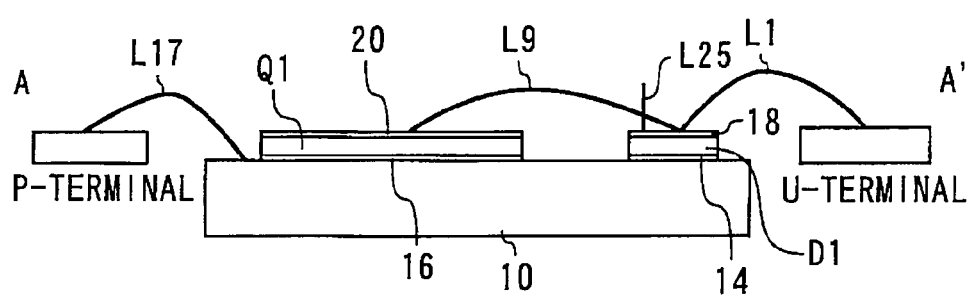
FIG. 11 is a sectional view taken along line A-A' in FIG. 10.

FIG. 10 is a top view showing a power module according to the second embodiment; and FIG. 11 is a sectional view taken along line A-A' in FIG. 10. Unlike the first embodiment, since diodes D1 to D4 are arrayed in line so that the lengths of Al wires L1 to L4 become the same, the parasitic inductances of the Al wires L1 to L4 are the same. However, the switching characteristics (recovery characteristics) of the diodes D1 and D3 are different from the switching characteristics of the diodes D2 and D4.

Figure 12:
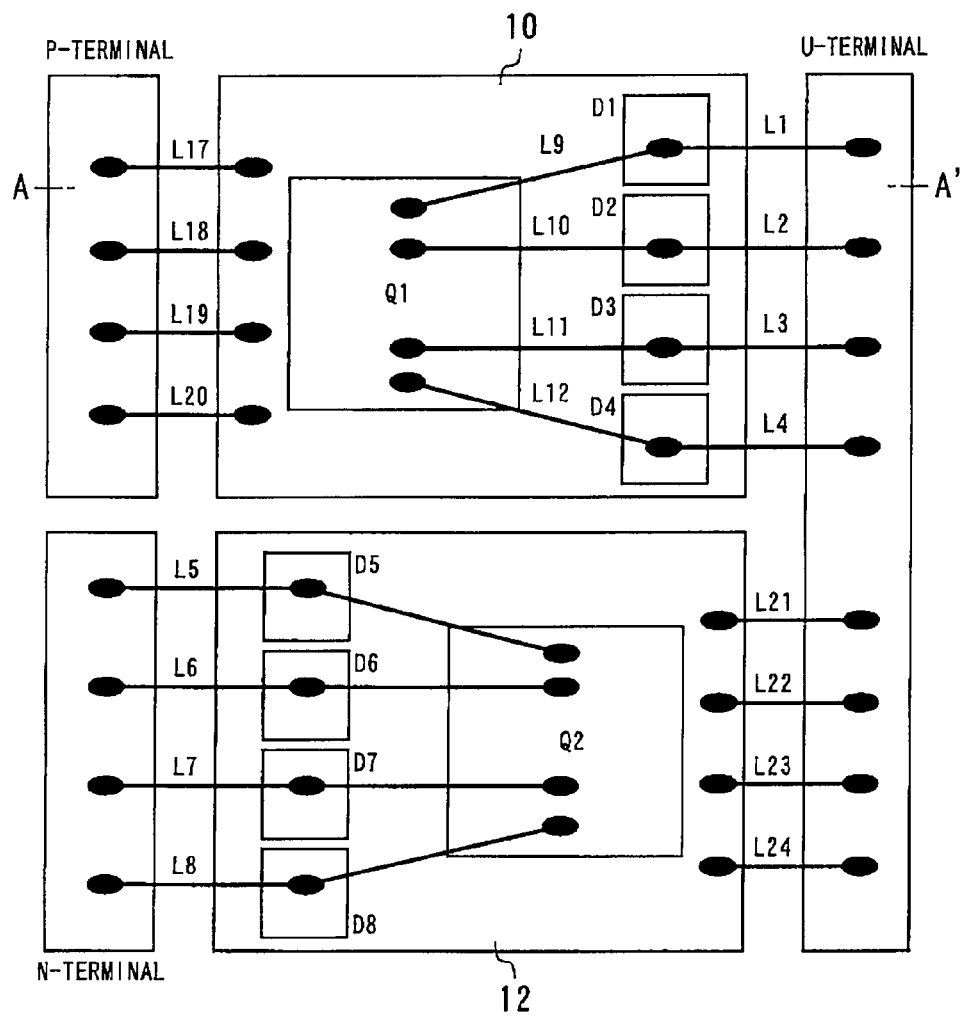
FIG. 12 is a top view showing a power module according to the second comparative example.
Figure 13:
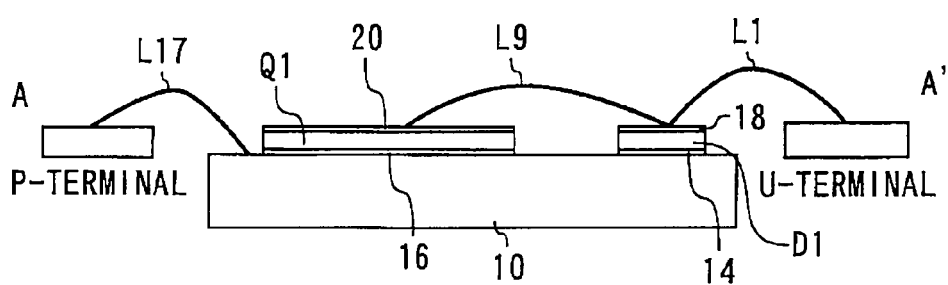
FIG. 13 is a sectional view taken along the line A-A' in FIG. 12.

Next, the effect of the second embodiment will be described in comparison to the second comparative example. FIG. 12 is a top view showing a power module according to the second comparative example, and FIG. 13 is a sectional view taken along the line A-A' in FIG. 12. No Al wires L25 to L28 are present in the second comparative example.

Figure 14:
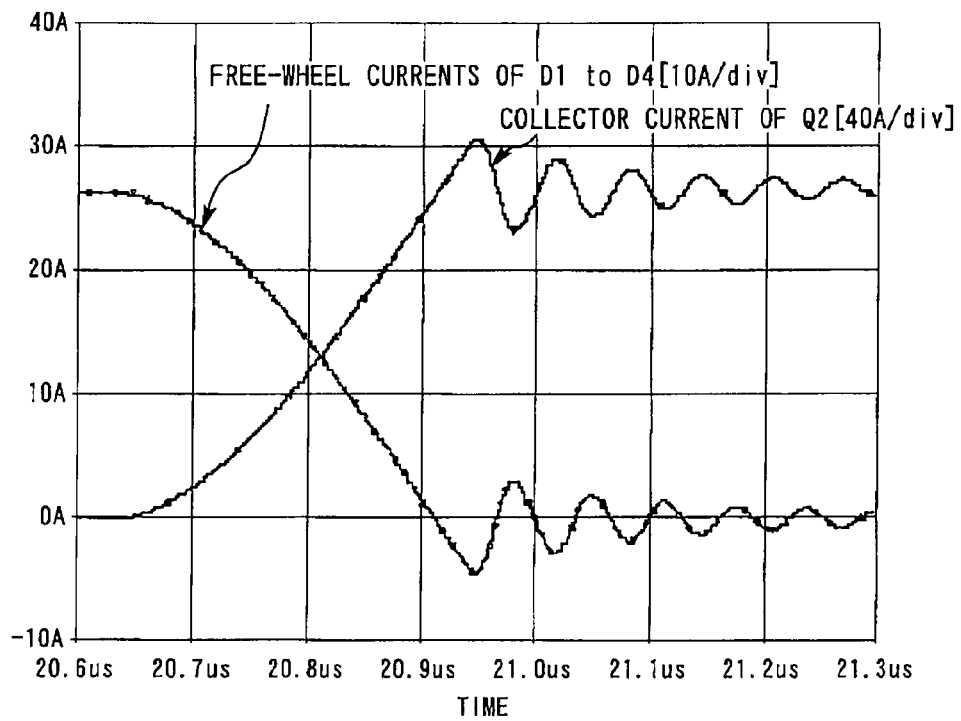
FIG. 14 is the result of simulation for the second comparative example.

FIG. 14 is the result of simulation for the second comparative example. In the circuit shown in FIG. 6, diodes D1 to D4 have the same switching characteristics, and the simulation was carried out making the parasitic inductance of each of the wirings L1 to L4 be 4 nH. Since the parasitic inductance of each of the wirings L1 to L4 connecting the diodes D1 to D4 with the U-terminal is the same, and in addition, since the switching characteristics are the same the wave shapes of the current flowing through diodes D1 to D4 match each other.

Figure 15:
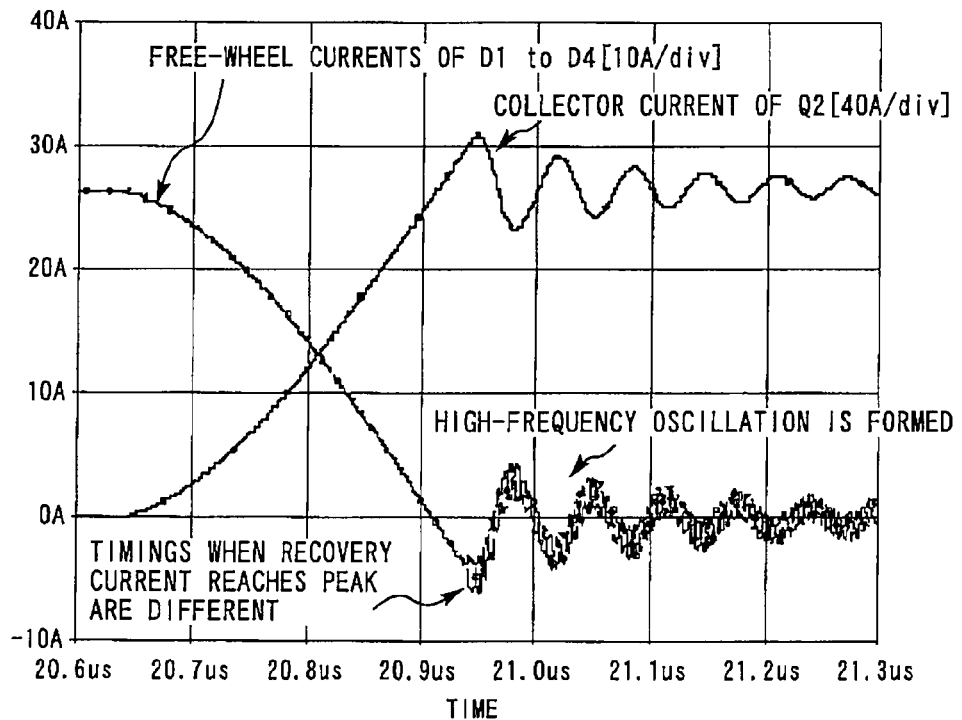
FIG. 15 is the result of simulation for the second comparative example.

FIG. 15 is the result of simulation for the second comparative example. Unlike with FIG. 14, the simulation was carried out for the case wherein the switching characteristics of the diodes D1 and D3 are slower than the switching characteristics of the diodes D2 and D4. The free-wheel current of the transistor Q2 at the time of turning ON substantially agrees; however, the timing when the recovery current reaches the peak becomes different. Therefore, after the recovery current has flowed, high-frequency oscillation occurs between the diodes D1 and D4 connected in parallel.

Whereas in the second embodiment, since the frequency band of the high-frequency oscillation can be transferred to the band with practically no problem by adding Al wires L25 to L28, as in the first embodiment, the radiation noise can be reduced.

Third Embodiment

Figure 16:
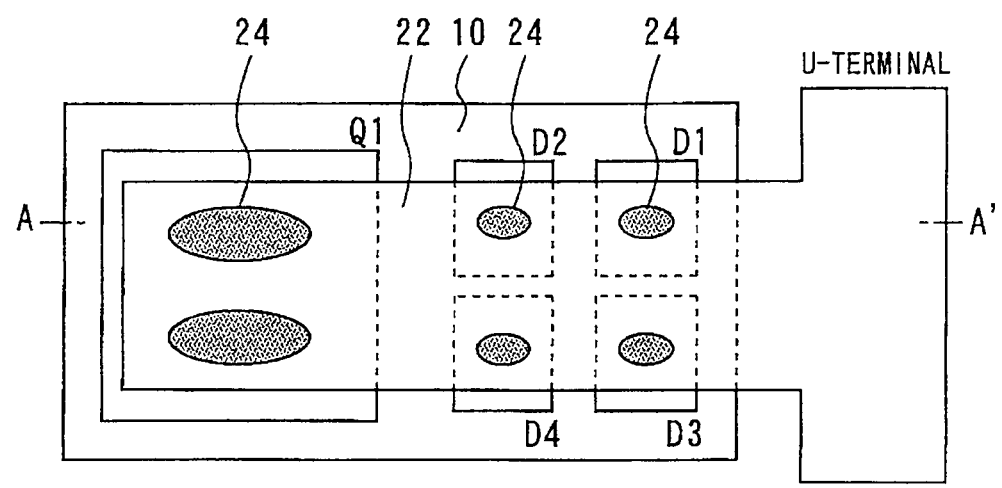
FIG. 16 is a top view showing a power module according to the third embodiment.
Figure 17:
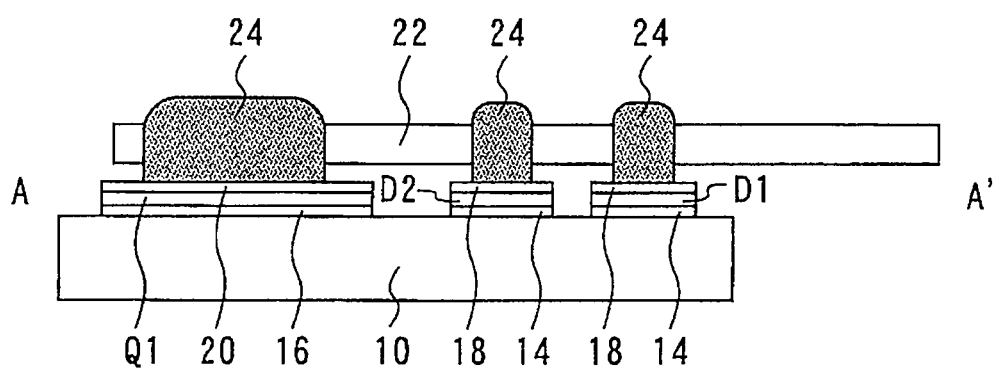
FIG. 17 is a sectional view taken along with the line A-A' in FIG. 16.

FIG. 16 is a top view showing a power module according to the third embodiment, and FIG. 17 is a sectional view taken along with the line A-A' in FIG. 16. Although the arrangement of the diodes D1 to D4 is the same as in the first embodiment, one metallic board 22 is used in place of Al wires L1 to L4, L9 to L12, L25, and L26. The metallic board 22 is connected to the diodes D1 to D4 with a solder 24 or the like.

By the use of the metallic board 22, since the parasitic inductance of wires between adjacent diodes is reduced more than the wire connection in the first embodiment, and the high-frequency oscillation frequency among the diodes D1 to D4 transits to a higher frequency, the radiation noise can be further reduced.

Fourth Embodiment

Figure 18:
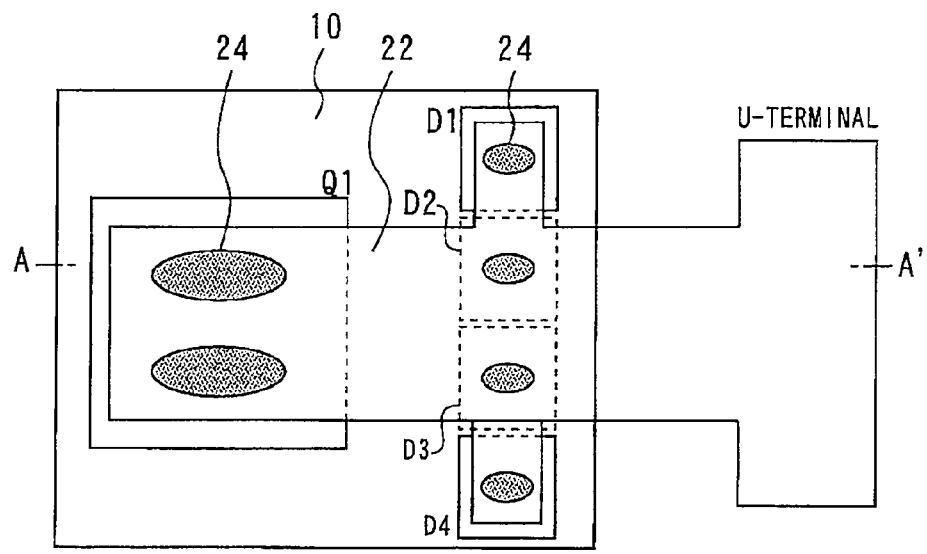
FIG. 18 is a top view showing a power module according to the fourth embodiment.
Figure 19:
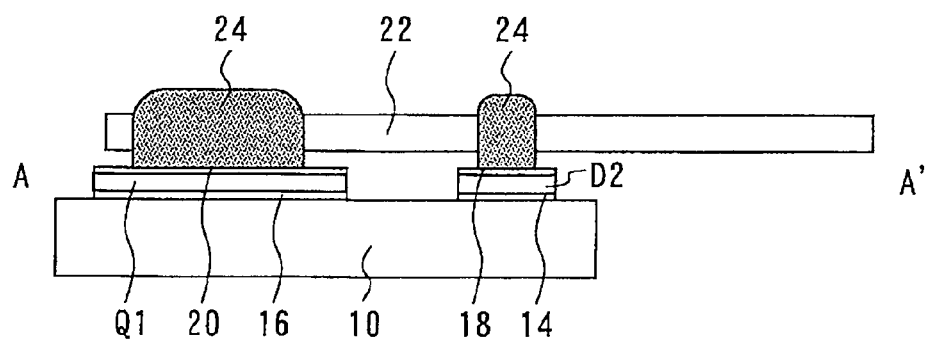
FIG. 19 is a sectional view taken along with the line A-A' in FIG. 18.

FIG. 18 is a top view showing a power module according to the fourth embodiment, and FIG. 19 is a sectional view taken along with the line A-A' in FIG. 18. Although the arrangement of the diodes D1 to D4 is the same as in the second embodiment, one metallic board 22 is used in place of Al wires L1 to L4, L9 to L12, L25, and L26. In this case also, the radiation noise can be reduced in the same manner as in the third embodiment.

Fifth Embodiment

Figure 20:
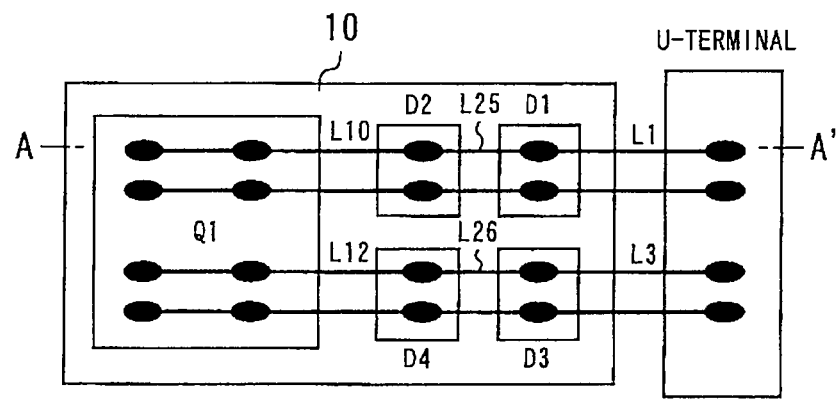
FIG. 20 is a top view showing a power module according to the fifth embodiment.
Figure 21:
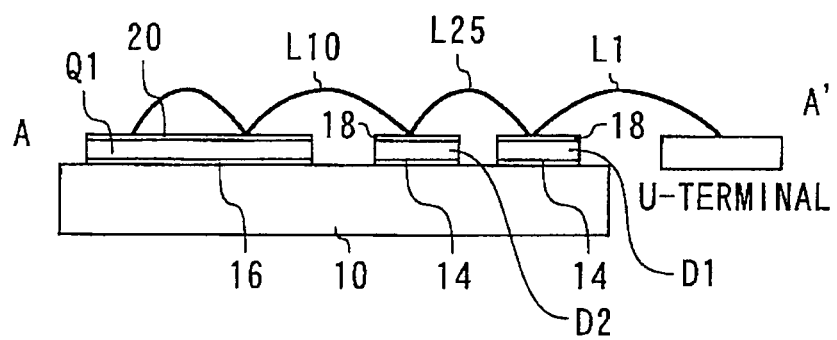
FIG. 21 is a sectional view taken along with the line A-A' in FIG. 20.

FIG. 20 is a top view showing a power module according to the fifth embodiment, and FIG. 21 is a sectional view taken along with the line A-A' in FIG. 20. The Al wire L1 connects the anode 18 of the diode D1 to the U-terminal. The Al wire L25 connects the anode 18 of the diode D1 to the anode 18 of the diode D2. The Al wires L1 and L25 connect the anode 18 of the diode D2 to the U-terminal. The Al wire L3 connects the anode 18 of the diode D3 to the U-terminal. The Al wire L26 connects the anode 18 of the diode D1 to the anode 18 of the diode D4. The Al wires L3 and L26 connect the anode 18 of the diode D4 to the U-terminal. Thereby, since the inductances between adjacent diodes (between D1 and D2, between D3 and D4) are reduced, and the high-frequency oscillation frequency among the diodes D1 to D4 transits to a higher frequency, the radiation noise can be further reduced.

In the first to fifth embodiments described above, although diodes are connected in parallel, the present invention is also effective when transistors, such as IGBTs and MOSFETs, are connected in parallel.

The switching element is not limited to those formed by silicon, but may be those formed by a wide-band-gap semiconductor having a larger band gap than silicon. The wide-band-gap semiconductors include, for example, silicon carbide, gallium nitride-based materials, or diamond.

Since high-frequency oscillation occurs more easily in the transistor formed by a wide-band-gap semiconductor than in the transistor formed by silicon, the high-frequency oscillation between elements connected in parallel at the time of parallel connection frequently causes problems. Therefore, the present invention is particularly effective in the case wherein the switching element is formed of a wide band-gap semiconductor.

In addition, since an element formed of a wide band-gap semiconductor has a high breakdown voltage and allowable current density, the size of the element can be reduced. By using a down-sized element, the size of the power module equipped with such elements can also be reduced. Since the heat resistance of the element is high, the size of the heat dissipation fin can be reduced, and since the water-cooled parts can be cooled by the air, the power module can be further down-sized. Furthermore, since the power loss of the element is low and the element is highly efficient, the efficiency of the power module can be elevated. Although it is desirable that both the transistor and the diode be formed of wide-band-gap semiconductor, the above-described effect can be obtained if either one of elements is formed of a wide-band-gap semiconductor.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-175372, filed on Aug. 4, 2010 including specification, claims, drawings and summary, on which the Convention priority of the present application is based, are incorporated herein by reference in its entirety.

What is claimed is:

1. A power module comprising:
first and second terminals;
a switching element having a control electrode, a first electrode, and a second electrode which is connected to the second terminal;
a first diode having a first electrode, and a second electrode which is connected to the second terminal;
a second diode having a first electrode, and a second electrode which is connected to the second terminal;
a first wiring connecting the first electrodes of the switching element and the first diode to the first terminal;
a second wiring connecting the first electrodes of the switching element and the second diode to the first terminal;
a third wiring directly connecting the first electrode of the first diode to the first electrode of the second diode,
wherein parasitic inductances of the first and second wiring are different or switching characteristics of the first and second diodes are different.

2. The power module according to claim 1, wherein parasitic inductance of the third wiring is smaller than the parasitic inductances of the first and second wirings.

3. The power module according to claim 1, wherein resistance value of the third wiring is larger than resistance values of the first and second wirings.

4. The power module according to claim 1, wherein the first, second, and third wirings are provided by different portions of one metallic board.

5. The power module according to claim 1, wherein the first, second and third wirings are provided by different portions of one wire.

6. The power module according to claim 1, wherein the switching element and the first and second diodes include wide-band-gap semiconductors.

* * * * *